US011676801B2

(12) United States Patent
Shi et al.

(10) Patent No.: US 11,676,801 B2
(45) Date of Patent: Jun. 13, 2023

(54) METHODS AND APPARATUS FOR PROCESSING A SUBSTRATE

(71) Applicant: Applied Materials, Inc., Santa Clara, CA (US)

(72) Inventors: Tiefeng Shi, San Jose, CA (US); Keith A. Miller, Mountain View, CA (US); Gang Fu, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 236 days.

(21) Appl. No.: 17/333,873

(22) Filed: May 28, 2021

(65) Prior Publication Data

US 2022/0384149 A1     Dec. 1, 2022

(51) Int. Cl.
| | | |
|---|---|---|
| *H03H 7/40* | (2006.01) | |
| *H01J 37/32* | (2006.01) | |
| *H01L 21/02* | (2006.01) | |
| *H03H 7/38* | (2006.01) | |

(52) U.S. Cl.
CPC .. *H01J 37/32183* (2013.01); *H01J 37/32146* (2013.01); *H01L 21/02266* (2013.01); *H03H 7/383* (2013.01)

(58) Field of Classification Search
CPC .......... H01J 37/32183; H01J 37/32146; H01L 21/02266; H03H 7/383
See application file for complete search history.

(56) References Cited

U.S. PATENT DOCUMENTS

| | | |
|---|---|---|
| 9,059,680 B2 | 6/2015 | Shimomoto et al. |
| 10,269,540 B1 | 4/2019 | Carter et al. |
| 10,297,422 B2 | 5/2019 | Sato |
| 2005/0070123 A1 | 3/2005 | Hirano |
| 2015/0349750 A1 | 12/2015 | Van Zyl et al. |
| 2016/0268101 A1 | 9/2016 | Kaneko et al. |
| 2020/0176221 A1 | 6/2020 | Prager et al. |
| 2020/0234927 A1* | 7/2020 | Lozic ....................... H03H 7/40 |

OTHER PUBLICATIONS

International Search Report for PCT/US2022/024756, dated Aug. 5, 2022.

* cited by examiner

*Primary Examiner* — Henry Luong
(74) *Attorney, Agent, or Firm* — Moser Taboada

(57) ABSTRACT

Methods and apparatus for processing a substrate are provided herein. For example, a matching network for use with a plasma processing chamber comprises an input configured to connect to a power source, an output configured to connect to the plasma processing chamber, a V/I sensor connected between the input of the matching network and an output of the power source, a load capacitor connected in parallel with at least one capacitor connected in series with a load switch, a tuning capacitor connected in series with at least one capacitor connected in parallel with a tuning switch, and a multiple level pulsing phase/magnitude module connected to the V/I sensor and to a multiple level pulsing synchronization switch driver connected to each of the load switch and the tuning switch for activating at least one of the load switch and the tuning switch in response to a control signal, which is based on a V/I sensor measurement, received from the power source.

19 Claims, 5 Drawing Sheets

Tune cap value digitalized step size $$X_{TC}(s_0 s_1 s_2 \ldots s_n) = -\frac{j}{\omega}\left(\frac{1}{C_s} + \frac{\bar{s}_1}{C_1} + \frac{\bar{s}_2}{C_2} + \cdots \frac{\bar{s}_n}{C_n}\right) \ldots \ldots (1)$$

$$X_{TC}(s_1 s_2 \ldots s_n) = -\frac{j}{\omega}\left(\frac{\bar{s}_1}{C_1} + \frac{\bar{s}_2}{C_2} + \cdots \frac{\bar{s}_n}{C_n}\right) \ldots \ldots (2)$$

$$C_1 = \frac{C_2}{2} = \frac{C_3}{4} = \frac{C_4}{8} = \frac{C_n}{2^{n-1}} = C_t$$

Where $\bar{s}_n$ is binary number indicating the switch state of each switch, $\bar{s}_n = 1$ represents close state of switch, the reactance difference introduced by the adaptive tuning network is always the same value: $1/(j\omega 2^{n-1}C_t)$ Ohm; $C_t$ is the step size of capacitance.

$$C_{total}(s_1, s_2, \ldots s_n) = \frac{2^{n-1}\bar{s}_1 + 2^{n-2}\bar{s}_2 + \cdots \bar{s}_n}{2^{n-1}C_t} \ldots \ldots (3)$$

$$dR = 1/(j\omega 2^{n-1}C_t) \ldots \ldots (4)$$

$dR$ is the reactance step size.

FIG. 5A

Load cap value digitalized step size $$B_C(s_1 s_2 \ldots s_n) = j\omega(\bar{s}_1 C_1 + \bar{s}_2 C_2 + \cdots \bar{s}_n C_n) \ldots \ldots (1)$$

$$C_1 = \frac{C_2}{2} = \frac{C_3}{4} = \frac{C_4}{8} = \frac{C_n}{2^{n-1}} = C_t$$

Where $\bar{s}_n$ is binary number indicating the switch state of each switch, $\bar{s}_n = 1$ represents close state of switch, the admittance difference introduced by the adaptive tuning network is always the same value: $j\omega C_t$ siemens; $C_t$ is the step size of capacitance.

$$C_{total}(s_1, s_2, \ldots s_n) = C_t\left(\frac{2^{n-1}\bar{s}_1 + 2^{n-2}\bar{s}_2 + \cdots \bar{s}_n}{2^{n-1}}\right) \ldots \ldots (2)$$

$$dB = j\omega 2^{n-1}C_t \ldots \ldots (3)$$

$dB$ is the admittance step size.

FIG. 5B

METHODS AND APPARATUS FOR PROCESSING A SUBSTRATE

FIELD

Embodiments of the present disclosure generally relate to methods and apparatus for processing a substrate, and more particularly, to methods and apparatus that use multiple level pulsing fast tuning match networks for plasma processing.

BACKGROUND

Plasma processing chambers for processing a substrate are known. For example, a physical vapor deposition chamber is configured to deposit one or more layers of material on a substrate. During the deposition process, one or more matching networks coupled to the PVD chamber can be composed of analog circuits or half analog circuits and half digital circuits that are configured to calculate an impedance (or power) using measured voltage/current to maintain chamber matching, which is an important factor during substrate processing (e.g., plasma deposition processing). Conventional matching circuits, however, cannot match all pulsing power levels transmitted from a power supply (e.g., RF generator) to the processing chamber, For example, conventional matching network, typically, are configured to match to maximum power level point or are fixed to one power level point, ignoring other power level points. That is, frequency tuning provided by the matching network does not cover a range of multiple power level points. Moreover, current matching networks are sometimes configured to use a solid-state switch match configuration, but the lossy solid-state devices associated therewith limit a maximum power level.

SUMMARY

Methods and apparatus for processing a substrate are provided herein. In some embodiments, a matching network for use with a plasma processing chamber comprises an input configured to connect to a power source, an output configured to connect to the plasma processing chamber, a VII sensor connected between the input of the matching network and an output of the power source, a load capacitor connected in parallel with at least one capacitor connected in series with a load switch, a tuning capacitor connected in series with at least one capacitor connected in parallel with a tuning switch, and a multiple level pulsing phase/magnitude module connected to the V/I sensor and to a multiple level pulsing synchronization switch driver connected to each of the load switch and the tuning switch for activating at least one of the load switch and the tuning switch in response to a control signal, which is based on a VA sensor measurement, received from the power source.

In accordance with at least some embodiments, an apparatus for processing a substrate comprises a processing chamber configured to receive a substrate for plasma processing, a power source connected to the processing chamber and configured to transmit a control signal, and a matching network for use with a plasma processing chamber comprising an input connected to the power source, an output connected to the plasma processing chamber, a V/I sensor connected between the input of the matching network and an output of the power source, a load capacitor connected in parallel with at least one capacitor connected in series with a load switch, a tuning capacitor connected in series with at least one capacitor connected in parallel with a tuning switch, and a multiple level pulsing phase/magnitude module connected to the V/I sensor and to a multiple level pulsing synchronization switch driver connected to each of the load switch and the tuning switch for activating at least one of the load switch and the tuning switch in response to the control signal, which is based on a V/I sensor measurement, received from the power source received from the power source.

In accordance with at least some embodiments, a method of processing a substrate comprises measuring a V/I at an input of a matching network connected between a power source and a plasma processing chamber during operation, transmitting a control signal from the power source to the matching network, and activating at least one of a load switch or a tuning switch in response to the control signal, which is based on a V/I measurement, received from the power source received from the power source.

Other and further embodiments o the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIGS. 5A and 5B illustrate the variables associated with tunable capacitance value digitalized step sizes and load capacitance value digitalized step sizes, respectively, in accordance with at least some embodiments of the present disclosure.

Figure 1:
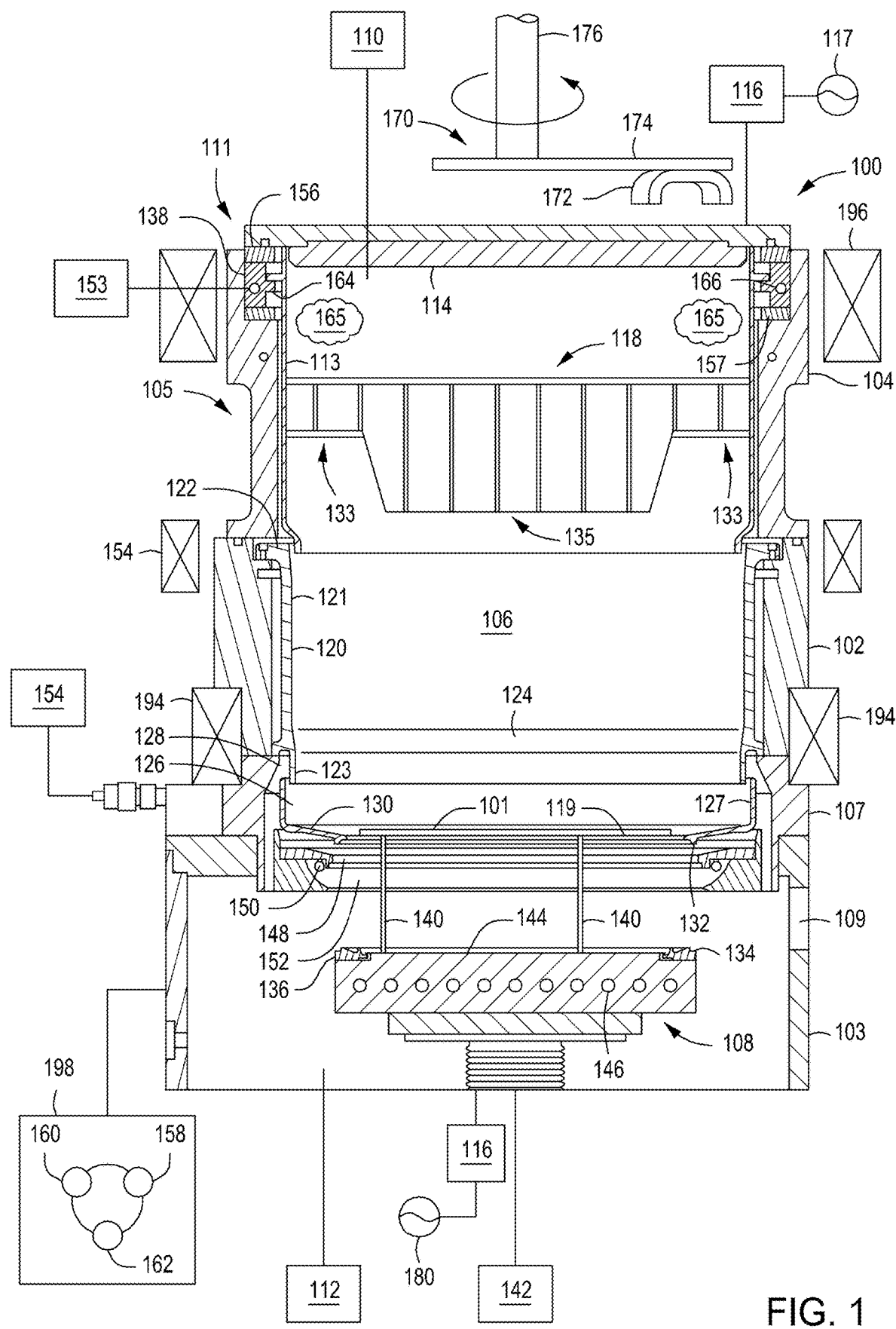
FIG. 1 is a schematic diagram of a plasma processing chamber, in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods and apparatus for processing a substrate are provided herein. For example, disclosed herein are matching networks that are configured to provide impedance matching for multiple power levels. The matching networks described herein use an algorithm to predict the multiple power level impedances to set an impedance grip adaptively with recipe calibration. The matching networks described herein are configured for operation in a hard switch tuning mode and mechanical switch tuning mode. Unlike conventional matching networks, the matching networks described herein provide impedance matching over multiple power level pulsing, overcome step time limitation/minimum deposition amount, provide higher ion energy under same damage level as compared to conventional matching networks, reduce overhang, and provide a pulse width as low as 10 μs.

FIG. 1 depicts a schematic side view of a processing chamber 100 (e.g., a plasma processing chamber) including a matching network, in accordance with at least some embodiments of the present disclosure. In some embodiments, the processing chamber 100 is PVD processing chamber suitable for sputter depositing materials on a substrate having a given diameter. Illustrative examples of suitable PVD chambers that may be adapted to benefit from the present disclosure include those commercially available from Applied Materials, Inc., of Santa Clara, Calif. Other processing chambers available from Applied Materials, Inc. as well as other manufacturers may also be adapted in accordance with the embodiments described herein.

The processing chamber 100 generally includes an upper sidewall 102, a lower sidewall 103, a ground adapter 104, and a lid assembly 111 defining a body 105 that encloses an interior volume 106. An adapter plate 107 may be disposed between the upper sidewall 102 and the lower sidewall 103.

A substrate support 108 is disposed in the interior volume 106 of the processing chamber 100. The substrate support 108 is configured to support a substrate having a given diameter (e.g., 150 mm, 200 mm, 300 mm, 450 mm, or the like). A substrate transfer port 109 is formed in the lower sidewall 103 for transferring substrates into and out of the interior volume 106.

A gas source 110 is coupled to the processing chamber 100 to supply process gases into the interior volume 106. In some embodiments, process gases may include inert gases, non-reactive gases, and reactive gases, if necessary. Examples of process gases that may be provided by the gas source 110 include, but are not limited to, argon gas (Ar), helium (He), neon gas (Ne), nitrogen gas ($N_2$), oxygen gas ($O_2$), and water ($H_2O$) vapor among others.

A pumping device 112 is coupled to the processing chamber 100 in communication with the interior volume 106 to control the pressure of the interior volume 106. During deposition, the pressure level of the processing chamber 100 may be maintained at about 1 Torr or less. For example, in at least some embodiments, the pressure level of the processing chamber 100 may be maintained at about 1 mTorr to about 500 mTorr, e.g., about 300 mTorr.

The ground adapter 104 may support a target, such as a target 114. The target 114 can be fabricated from a material to be deposited on a substrate. In at least some embodiments, the target 114 may be fabricated from titanium (Ti), tantalum (Ta), tungsten (W), cobalt (Co), nickel (Ni), copper (Cu), aluminum (Al), alloys thereof, combinations thereof, or the like. In at least some embodiments, the processing chamber 100 is configured to deposit, for example, aluminum oxide ($AlO_2$), aluminum oxynitride (such as ALON), Co, Cu, Ta, tantalum nitride (TaN), tantalum oxynitride ($TaO_xN_y$), Ti, titanium oxynitride ($TiO_xN_y$), W, or tungsten nitride (WN) on a substrate.

The target 114 may be coupled to a source assembly comprising a power supply 117 for the target 114. The power supply 117 may be an RF power supply, which may be coupled to the target 114 via a matching network 116. In at least some embodiments, the power supply 117 may alternatively be a DC power supply, in which case the matching network 116 is omitted. In some embodiments, the power supply 117 may include both DC and RF power sources.

A magnetron 170 is positioned above the target 114 and may include a plurality of magnets 172 supported by a base plate 174 connected to a shaft 176, which may be axially aligned with the central axis of the processing chamber 100 and the substrate 101. The magnets 172 produce a magnetic field within the processing chamber 100 near the front face of the target 114 to generate a plasma 165 so a significant flux of ions strike the target 114, causing sputter emission of target material. The magnets 172 may be rotated about the shaft 176 to increase uniformity of the magnetic field across the surface of the target 114. In general, the magnets 172 may be rotated such that the innermost magnet position during rotation of the magnets 172 is disposed above or outside of the diameter of the substrate being processed (e.g., the distance from the axis of rotation to the innermost position of the magnets 172 is equal to or greater than the diameter of the substrate being processed).

The processing chamber 100 includes a collimator 118. The collimator 118 can be positioned in the interior volume 106 between the target 114 and the substrate support 108. A central region 135 of the collimator 118 generally corresponds to the diameter of the substrate being processed (e.g., is equal to or substantially equal to the diameter of the substrate). Thus, a peripheral region 133 of the collimator 118 generally corresponds to an annular region radially outward of the substrate being processed (e.g., the inner diameter of the peripheral region 133 is substantially equal to or greater than the diameter of the substrate). In some embodiments, the collimator 118 may be electrically biased to control ion flux to the substrate and neutral angular distribution at the substrate, as well as to increase the deposition rate due to the added DC bias.

The collimator 118 is coupled to an upper shield 113 and supported by a process tool adapter 138, which is coupled to the upper shield 113 and may be a cooled process tool adapter, such as in the illustrated embodiment. The process tool adapter 138 may be made from suitable conductive materials compatible with processing conditions in the processing chamber 100. An insulator ring 156 and an insulator ring 157 are disposed on either side of the process tool adapter 138 to electrically isolate the process tool adapter 138 from the ground adapter 104, The insulator rings 156, 157 may be made from suitable process compatible dielectric materials.

The process tool adapter 138 includes one or more features to facilitate supporting a process tool within the interior volume 106, such as the collimator 118. For example, as shown in FIG. 1, the process tool adapter 138 includes a mounting ring, or shelf 164 that extends in a radially inward direction to support the upper shield 113.

In some embodiments, a coolant channel 166 may be provided in the process tool adapter 138 to facilitate flowing a coolant through the process tool adapter 138 to remove heat generated during processing. For example, the coolant channel 166 may be coupled to a coolant source 153 to provide a suitable coolant, such as water. The coolant channel 166 advantageously removes heat from the process tool (e.g., collimator 118) that is not readily transferred to other cooled chamber components, such as the ground adapter 104.

A radially inwardly extending ledge (e.g., the mounting ring, or shelf 164) is provided to support the upper shield 113 within the central opening within the interior volume 106 of the processing chamber 100. The shelf 164 is disposed in a location proximate the coolant channel 166 to facilitate maximizing the heat transfer from the collimator 118 to the coolant flowing in the coolant channel 166 during use.

The processing chamber 100 further includes a lower shield 120. The lower shield 120 may be provided in proximity to the collimator 118 and interior of the ground adapter 104 or the upper sidewall 102. The lower shield 120 may include a tubular body 121 having a radially outwardly extending flange 122 disposed in an upper surface of the tubular body 121. The flange 122 provides a mating interface with an upper surface of the upper sidewall 102. In some embodiments, the tubular body 121 of the lower shield 120 may include a shoulder region 123 having an inner diameter that is less than the inner diameter of the remainder of the tubular body 121. In some embodiments, the inner surface of the tubular body 121 transitions radially inward along a tapered surface 124 to an inner surface of the shoulder region 123. A shield ring 126 may be disposed in the processing chamber 100 adjacent to the lower shield 120 and intermediate of the lower shield 120 and the adapter plate 107. The shield ring 126 may be at least partially disposed in a recess 128 formed by an opposing side of the shoulder region 123 of the lower shield 120 and an interior sidewall of the adapter plate 107.

The shield ring 126 may include an axially projecting annular sidewall 127 that has an inner diameter that is greater than an outer diameter of the shoulder region 123 of the lower shield 120. A radial flange 130 extends from the annular sidewall 127. The radial flange 130 includes a protrusion 132 formed on a lower surface of the radial flange 130. The protrusion 132 may be a circular ridge extending from the surface of the radial flange 130 in an orientation that is substantially parallel to the inside diameter surface of the annular sidewall 127 of the shield ring 126. The protrusion 132 is generally adapted to mate with a recess 134 formed in an edge ring 136 disposed on the substrate support 108. The recess 134 may be a circular groove formed in the edge ring 136. The engagement of the protrusion 132 and the recess 134 centers the shield ring 126 with respect to the longitudinal axis of the substrate support 108. The substrate 101 (shown supported on lift pins 140) is centered relative to the longitudinal axis of the substrate support 108 by coordinated positioning calibration between the substrate support 108 and a robot blade (not shown).

In operation, a robot blade (not shown) having the substrate 101 disposed thereon is extended through the substrate transfer port 109. The substrate support 108 may be lowered to allow the substrate 101 to be transferred to the lift pins 140 extending from the substrate support 108. Lifting and lowering of the substrate support 108 and/or the lift pins 140 may be controlled by a drive 142 coupled to the substrate support 108. The substrate 101 may be lowered onto a substrate receiving surface 144 of the substrate support 108. With the substrate 101 positioned on the substrate receiving surface 144 of the substrate support 108, sputter deposition may be performed on the substrate 101. The edge ring 136 may be electrically insulated from the substrate 101 during processing.

After sputter deposition, the substrate 101 may be elevated utilizing the lift pins 140 to a position that is spaced away from the substrate support 108. The elevated location may be proximate one or both of the shield ring 126 and a reflector ring 148 adjacent to the adapter plate 107. The adapter plate 107 includes one or more lamps 150 coupled to the adapter plate 107 at a position intermediate of a lower surface of the reflector ring 148 and a concave surface 152 of the adapter plate 107. The lamps 150 provide optical and/or radiant energy in the visible or near visible wavelengths, such as in the infra-red (IR) and/or ultraviolet (UV) spectrum. The energy from the lamps 150 is focused radially inward toward the backside (i.e., lower surface) of the substrate 101 to heat the substrate 101 and the material deposited thereon.

After controlling the substrate 101 to a predetermined temperature, the substrate 101 is lowered to a position on the substrate receiving surface 144 of the substrate support 108. The substrate 101 may be rapidly cooled utilizing the thermal control channels 146 in the substrate support 108 via conduction. The substrate 101 may be removed from the processing chamber 100 through the substrate transfer port 109 for further processing.

A first set of magnets 196 are disposed adjacent to the ground adapter 104 to assist with generating the magnetic field to guide dislodged ions from the target 114 through the peripheral region 133. A second set of magnets 194 are disposed in a position to form a magnetic field between the bottom of the collimator 118 and the substrate to guide the metallic ions dislodged from the target 114 and distribute the ions more uniformly over the substrate 101. A third set of magnets 154 are disposed between the first and second set of magnets 196, 194 and about centered with or below a substrate-facing surface of the central region 135 of the collimator 118 to further guide the metallic ions towards the center of the substrate 101.

An RF power source 180 may be coupled to the processing chamber 100 through the substrate support 108 to provide a bias power between the target 114 and the substrate support 108. A match network (e.g., the matching network 116) can be coupled between the RF power source 180 and the substrate support 108. The RF power source 180 may have a frequency between about 400 Hz and about 60 MHz. such as about 13.56 MHz. In some embodiments, the RE power source 180 can provide an amplitude pulsing modulated phase-shift keying signal and provide RF power at the same frequency that the matching network 116 operates at, as will be described in greater detail below.

A controller 198 is coupled to the processing chamber 100. The controller 198 includes a central processing unit 160, a memory 158, and support circuits 162. The controller 198 is utilized to control the process sequence, regulating the gas flows from the gas source 110 into the processing chamber 100 and controlling ion bombardment of the target 114. The central processing unit 160 may be of any form of a general-purpose computer processor that can be used in an industrial setting. The software routines (e.g., instructions) can be stored in the memory 158 (e.g., non-transitory computer readable storage medium), such as random-access memory, read only memory, floppy or hard disk drive, or other form of digital storage. The support circuits 162 are conventionally coupled to the central processing unit 160 and may comprise cache, clock circuits, input/output subsystems, power supplies, and the like. The software routines, when executed by the central processing unit 160, transform the central processing unit into a specific purpose computer (the controller 198) that controls the processing chamber 100 such that the processes, including the matching network processes disclosed below, are performed in accordance with embodiments of the present disclosure. The software routines may also be stored and/or executed by a second controller (not shown) that is located remotely from the processing chamber 100.

During processing, material is sputtered from the target 114 and deposited on the surface of the substrate 101. The target 114 and the substrate support 108 are biased relative to each other by the power supply 117 or the RF power source 180 to maintain a plasma formed from the process gases supplied by the gas source 110. The DC pulsed bias power applied to the collimator 118 also assists controlling ratio of the ions and neutrals passing through the collimator 118, advantageously enhancing the trench sidewall and bottom fill-up capability. The ions from the plasma are accelerated toward and strike the target 114, causing target material to be dislodged from the target 114. The dislodged target material and process gases forms a layer on the substrate 101 with desired compositions. Additionally, during processing the matching network 116 is configured to provide impedance matching using match-frequency fine tuning (FIG. 2) and/or match-mechanical fine tuning (FIG. 3) to reduce, if not eliminate, reflective power back to the RF power source 180 and/or the power supply 117.

Figure 2:
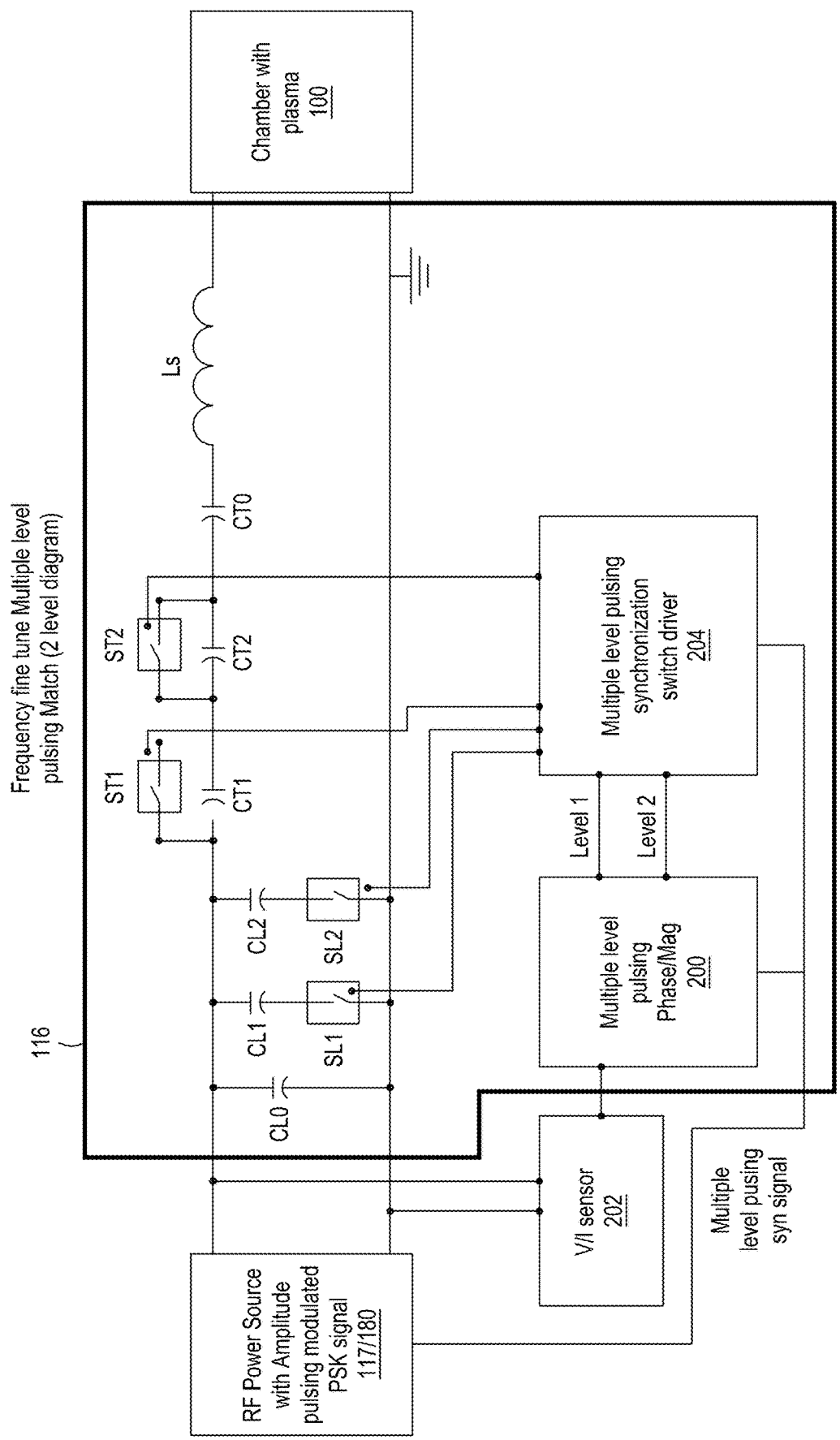
FIG. 2 is a schematic diagram of a matching circuit, in accordance with at least some embodiments of the present disclosure.

FIG. 2 is a schematic diagram of the matching network 116, in accordance with at least some embodiments of the present disclosure. The matching network of FIG. 2 is configured as a hard switch multiple level fast tuning match. The matching network 116 of FIG. 2 provides impedance matching between the processing chamber 100 and a power source (e.g., the power supply 117 and/or the RF power source 180) during processing. For example, in at least some embodiments, the matching network 116 can be configured as a hard switch multiple level fast tuning matching network.

The matching network 116 comprises a multiple level pulsing phase/magnitude module (module 200). The module 200 comprises one or more levels each having a corresponding phase and magnitude. For illustrative purposes, two levels are shown in FIG. 2. The module 200 is connected to a voltage/current (V/I) sensor 202, which is configured to measure an impedance based on a corresponding voltage and current. The module 200 is also connected to a multiple level pulsing synchronization switch driver (driver 204) that is connected to one or more load switches that corresponds to the number of levels. For example, in the illustrated embodiments, two load switches $S_{L1}$ and $S_{L2}$ are shown. Likewise, the driver 204 is also connected to one or more tuning switches, e.g., tuning switches $S_{T1}$ and $S_{T2}$. The load switches $S_{L1}$ and $S_{L2}$ are connected in series with two corresponding load capacitors, for example, load capacitor $C_{L1}$ and load capacitor $C_{L2}$. Similarly, the tuning switches $S_{T1}$ and $S_{T2}$ and are connected in parallel with two corresponding tuning capacitors, for example, tuning capacitor $C_{T1}$ and tuning capacitor $C_{T2}$. The capacitors used/described herein can any suitable capacitor including, but not limited to, solid-state capacitors, variable (motorized) capacitors, vacuum capacitors, etc. During use, one of the load switches $S_{L1}$ and $S_{L2}$ are activated and one of the tuning switches $S_{T1}$ and $S_{T2}$ are activated based on a control signal transmitted from an RF power source. The control signal, e.g., a multiple level pulsing synchronization signal, is based on a WI sensor measurement. For example, in at least some embodiments, the control signal is an amplitude pulsing modulated phase-shift keying signal.

In at least some embodiments (e.g., a level 2), an additional load capacitor $C_{L0}$ is connected in parallel with the load capacitor $C_{L1}$ and load capacitor $C_{L2}$. Similarly, an additional tuning capacitor $C_{T0}$ is connected in series with the tuning capacitor $C_{T1}$ and tuning capacitor $C_{T2}$. In at least some embodiments, an inductor $L_S$ can be connected in series with the tuning capacitor $C_{T0}$. The additional load capacitor $C_{L0}$ and the additional tuning capacitor $C_{T0}$ can provide a starting point of tuning range for both the load capacitors and the tuning capacitors. The load capacitor $C_{L0}$ connected in parallel with the load capacitor $C_{L1}$ and load capacitor $C_{L2}$ and the tuning capacitor $CC_{T0}$ connected in series with the tuning capacitor $C_{T1}$ and tuning capacitor $C_{T2}$ represent a first level and a second level having a phase/amplitude magnitude that corresponds to a phase/amplitude magnitude provided on the control signal received from the power source.

Figure 3:
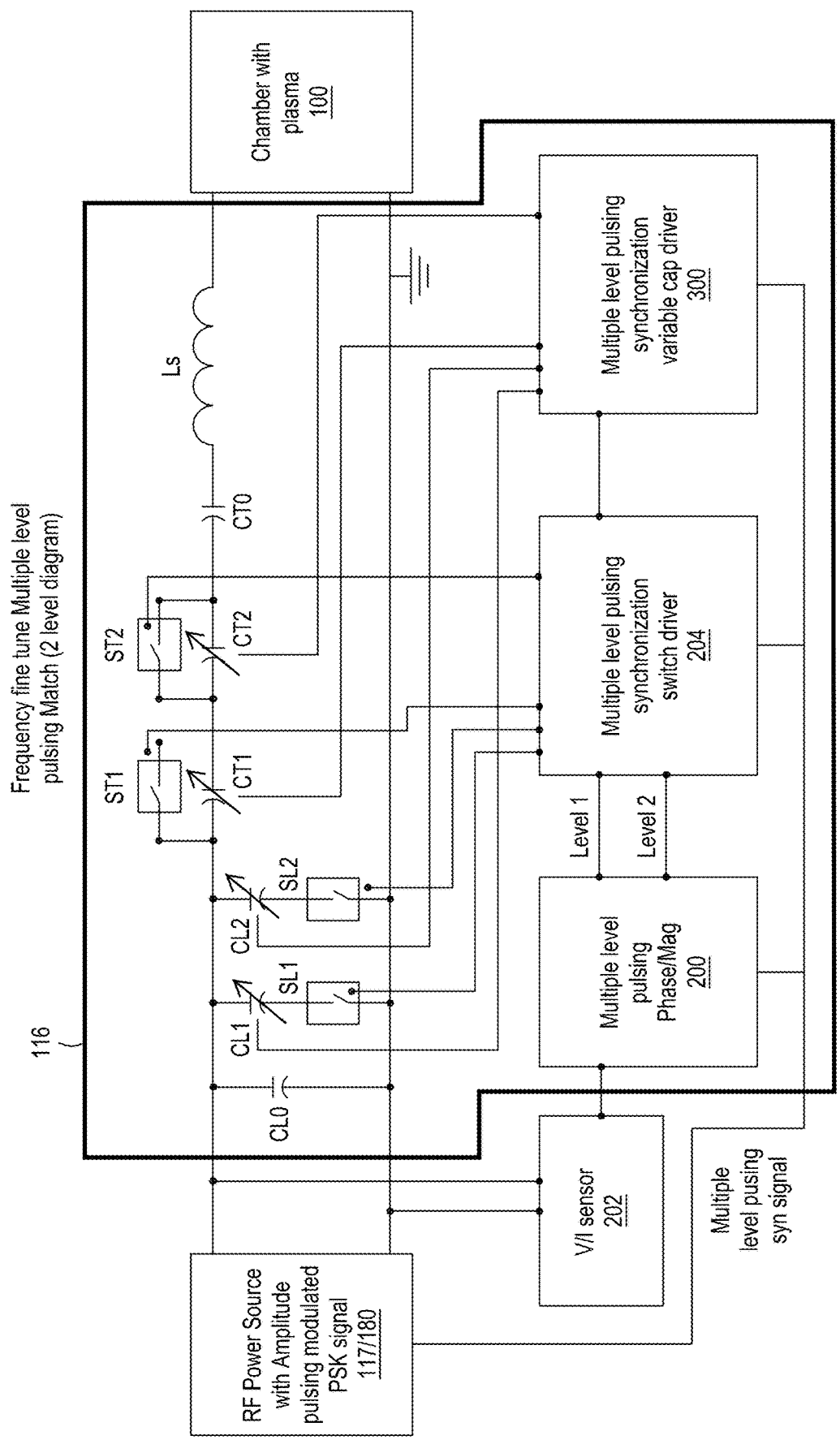
FIG. 3 is a schematic diagram of a matching circuit, in accordance with at least some embodiments of the present disclosure.

A control algorithm, under control of the controller 198, operates in a closed control loop that uses a tune capacitor position digitalized preset comprising a relay setting and a corresponding capacitor setting. For example, the matching networks described herein combine solid-state switch capacitors (illustrated in FIG. 2) and variable capacitors (vacuum devices) (illustrated in FIG. 3) with archived fast tuning by digitalized capacitor values with adaptive resolution for multiple pulsing levels of the RF power sources (e.g., RF power source 180 and/or the power supply 117 when configured as an RF power source). A dedicated amplitude modulation signal (e.g., the control signal) with synchronized pulsing levels enable multiple phase/amplitude magnitude devices to control the load capacitor $C_{L1}$, load capacitor $C_{L2}$, the tuning capacitor $C_{T1}$, and the tuning capacitor $C_{T2}$. For example, for each level (e.g., 2, 3, 4, 5, ... levels) the control algorithm uses the driver 204, which is synchronized to drive the switches (e.g., the load switches $S_{L1}$ and $S_{L2}$ and the tuning switches $S_{T1}$ and $S_{T2}$ (e.g., for level 2) to control each corresponding capacitor enable (e.g., the load capacitor $C_{L1}$, load capacitor $C_{L2}$, the tuning capacitor $C_{T1}$, and the tuning capacitor $C_{T2}$) for hard switch mode fast tuning match, or to drive both the load switches and $S_{L1}$ and $S_{L2}$ the tuning switches $S_{T1}$ and $S_{T2}$ and a motor (not shown) for match-mechanical fast tune mode (FIG. 3). For example, during operation the RF power source (e.g., can transmit the control signal with phase/amplitude magnitude is received at the module 200 that detects the phase/amplitude magnitude and compares the phase/amplitude magnitude for each level. The module 200 transmits a signal to the driver 204 to drive a load/tune capacitor, respectively (e.g., the load capacitor $C_{L1}$, load capacitor $C_{L2}$, the tuning capacitor $C_{T1}$, and the tuning capacitor $C_{T2}$ (e.g., for level 2) in a uniform step size. A tunable capacitance value digitalized step size can he calculated using the equations illustrated in FIG. 5A. Similarly, a load capacitance value digitalized step size can be calculated using the equations illustrated in FIG. 5B.

The load switches $S_{L1}$ and $S_{L2}$ and the tuning switches $S_{T1}$ and $S_{T2}$ can be any switch suitable for performing the processes described herein. For example, the load switches $S_{L1}$ and $S_{L2}$ and the tuning switches $S_{T1}$ and $S_{T2}$ can be a solid-state switch (relay), a vacuum relay, or pin diode.

FIG. 3 is a schematic diagram of the matching network 116, in accordance with at least some embodiments of the present disclosure. The matching network 116 of FIG. 3 is configured as a mechanical switch multiple level fast tuning match. The matching network 116 of FIG. 3 is substantially identical to the matching network 116 of FIG. 2. Accordingly, only the features that are unique to the matching network 116 of FIG. 3 are described herein.

Unlike the matching network 116 of FIG. 2, the matching network 116 of FIG. 3 further comprises a multiple level pulsing synchronization variable capacitor driver 300 (driver 300) that is connected to the load capacitor $C_{L1}$, load capacitor $C_{L2}$, the tuning capacitor $C_{T1}$, and the tuning capacitor $C_{T2}$, which can be variable capacitors (vacuum capacitors). Accordingly, during operation, the driver 300 receives a signal from the driver 204 and adjusts one or more of the load capacitor $C_{L1}$, load capacitor $C_{L2}$, the tuning capacitor $C_{T1}$, and the tuning capacitor $C_{T2}$ based on the signal received from the driver 204. As noted above, the matching network 116 of FIG. 3 is configured for mechanical fast tune mode.

Both matching networks of FIGS. 2 and 3 are configured for fast tuning methodologies, e.g., when compared to current tuning solutions. For example, FIG. 2 is based on fixed capacitance values (solid-state) that are digitalized from a corresponding digitalized cap model (not shown). Similarly, the matching network of FIG. 3 is based on variable tuning capacitance, also having capacitance values that are digitalized from a corresponding digitalized cap model.

A difference between the matching networks of FIG. 2 and FIG. 3 is an ability of the matching network of FIG. 2 to provide relatively faster switching than the matching network of FIG. 3, which has the ability to provide higher power (e.g., a higher power rating). For example, the matching network of FIG. 2 uses solid-state capacitors which provide faster switching and have lower current and breakdown voltages, which, in turn, can result in lower power capabilities. For example, the matching network of FIG. 2 can have a power rating of about 3 kW or less. On the other hand, if power is a primary issue, the matching network of FIG. 3 uses variable capacitors, e.g., vacuum capacitors, which provide a higher power rating, e.g., about 10 kW to about 20 kW, or higher, but not as fast switching/tuning capabilities, as a capacitance of the variable capacitors is varied via the driver 300.

Moreover, depending on switching requirements, as noted above, the load switches $S_{L1}$ and $S_{L2}$ and the tuning switches $S_{T1}$ and $S_{T2}$ can be a solid-state switch, a vacuum relay, and/or a pin diode. Thus, if faster switching is required, in at least some embodiments, the load switches $S_{L1}$ and $S_{L2}$ and the tuning switches $S_{T1}$ and $S_{T2}$ can be a solid-state switch (relay), which is capable of providing a switching frequency in the microsecond level. If slower switching is required, in at least some embodiments, the load switches $S_{L1}$ and $S_{L2}$ and the tuning switches $S_{T1}$ and $S_{T2}$ can be a vacuum relay or a pin diode, which is capable of providing a switching frequency in the millisecond level.

Figure 4:
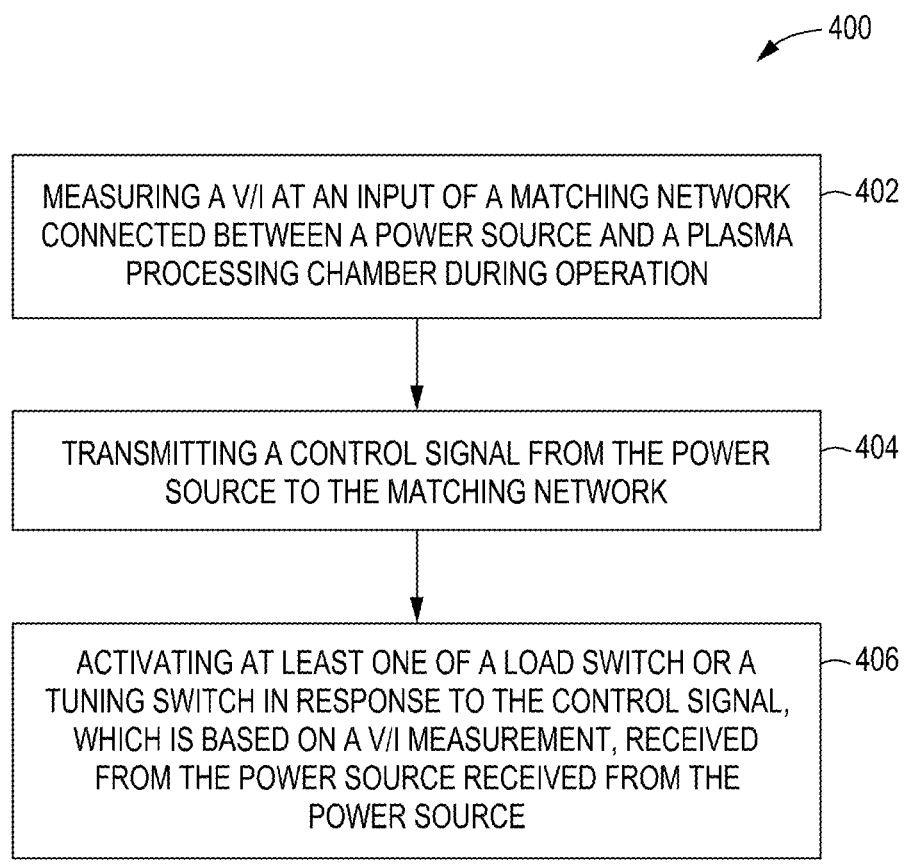
FIG. 4 is a flowchart of a method for processing a substrate, in accordance with at least some embodiments of the present disclosure.

FIG. 4 is a flowchart of a method 400 for processing a substrate, in accordance with at least some embodiments of the present disclosure. For illustrative purposes, the method 400 is described in terms of use with the matching network 116 of FIG. 2.

For example, during substrate processing (e.g., PVD), at 402 the method 400 comprises measuring a V/I at an input of a matching network connected between a power source and a plasma processing chamber during operation. For example, at 402 the RF power source 180 can transmit (in a pulse mode) pulsed RF power (at one or more of the above-referenced frequencies) to the processing chamber 100 based on a recipe used for PVD. The V/I sensor 202 can measure the V/I (e.g., impedance) of forward/reflected power at the input, Next, at 404 the method 400 comprises transmitting a control signal from the power source to the matching network. For example, as noted above the RF power source 180 transmits a synchronized control signal with phase/amplitude magnitude to the module 200. The module 200 detects the phase/amplitude magnitude and compares the phase/amplitude magnitude for each level e.g., two levels).

Next, at 406 the method 400 comprises activating at least one of a load switch or a tuning switch in response to the control signal, which is based on a V/I measurement, received from the power source. For example, the module 200 transmits a signal to the driver 204 to drive a load/tune capacitor, respectively (e.g., the load capacitor $C_{L1}$, load capacitor $C_{L2}$, the tuning capacitor $C_{T1}$, and the tuning capacitor $C_{T2}$) in a uniform step size to provide impedance matching during operation.

While the foregoing is directed to embodiments of the present disclosure, other and further embodiments of the disclosure may be devised without departing from the basic scope thereof.

The invention claimed is:

1. A matching network for use with a plasma processing chamber, comprising:
   an input configured to connect to a power source;
   an output configured to connect to the plasma processing chamber;
   a V/I sensor connected between the input of the matching network and an output of the power source;
   a load capacitor connected in parallel with at least one capacitor connected in series with a load switch;
   a tuning capacitor connected in series with at least one capacitor connected in parallel with a tuning switch; and
   a multiple level pulsing phase/magnitude module connected to the V/I sensor and to a multiple level pulsing synchronization switch driver connected to each of the load switch and the tuning switch for activating at least one of the load switch and the tuning switch in response to a control signal, which is based on a V/I sensor measurement, received from the power source.

2. The matching network of claim 1, further comprising an inductor connected in series with the tuning capacitor.

3. The matching network of claim 1, further comprising a multiple level pulsing synchronization variable capacitor driver connected to each of the at least one capacitor connected in series with the load switch and the at least one capacitor connected in parallel with the tuning switch.

4. The matching network of claim 1, further comprising a control algorithm that operates in a closed control loop that uses a tune capacitor position digitalized preset comprising a relay setting and a corresponding capacitor setting.

5. The matching network of claim 1, wherein the load capacitor connected in parallel with at least one capacitor connected in series with the load switch and the tuning capacitor connected in series with at least one capacitor connected in parallel with the tuning switch represent a first level having a phase/magnitude that corresponds to a phase/magnitude provided on the control signal received from the power source.

6. The matching network of claim 1, wherein he control signal is an amplitude pulsing modulated phase-shift keying signal.

7. The matching network of claim 1, wherein the plasma processing chamber is a physical vapor deposition chamber.

8. An apparatus or processing a substrate, comprising:
   a processing chamber configured to receive a substrate for plasma processing;
   a power source connected to the processing chamber and configured to transmit a control signal; and
   a matching network for use with a plasma processing chamber, comprising:
   an input connected to the power source;
   an output connected to the plasma processing chamber;
   a V/I sensor connected between the input of the matching network and an output of the power source;
   a load capacitor connected in parallel with at least one capacitor connected in series with a load switch;
   a tuning capacitor connected in series with at least one capacitor connected in parallel with a tuning switch; and a multiple level pulsing phase/magnitude module connected to the WI sensor and to a multiple level pulsing synchronization switch driver connected to each of the load switch and the tuning switch for activating at least one of the load switch and the tuning switch in response to the control signal, which is based on a sensor measurement, received from the power source received from the power source.

9. The apparatus of claim 8, wherein the matching network further comprises an inductor connected in series with the tuning capacitor.

10. The apparatus of claim 8, wherein the matching network further comprises a multiple level pulsing synchronization variable capacitor driver connected to each of the at least one capacitor connected in series with the load switch and the at least one capacitor connected in parallel with the tuning switch.

11. The apparatus of claim 8, wherein the matching network further comprises a control algorithm that operates in a closed control loop that uses a tune capacitor position digitalized preset comprising a relay setting and a corresponding capacitor setting.

12. The apparatus of claim 8, wherein the load capacitor connected in parallel with at least one capacitor connected in series with the load switch and the tuning capacitor connected in series with at least one capacitor connected in parallel with the tuning switch represent a first level having a phase/magnitude that corresponds to a phase/magnitude provided on the control signal received from the power source.

13. The apparatus of claim 8, wherein the power source is operable in a pulse mode.

14. The apparatus of claim 8, wherein the control signal is an amplitude pulsing modulated phase-shift keying signal.

15. The apparatus of claim 8, wherein the plasma processing chamber is a physical vapor deposition chamber.

16. A method of processing a substrate, comprising:
measuring a V/I at an input of a matching network connected between a power source and a plasma processing chamber during operation; wherein the matching network comprises: a load capacitor connected in parallel with at least one capacitor connected in series with the load switch; a tuning capacitor connected in series with at least one capacitor connected in parallel with the tuning switch;
and a multiple level pulsing phase/magnitude module connected to a V/I sensor and to a multiple level pulsing synchronization switch driver connected to each of the load switch and the tuning switch; transmitting a control signal from the power source to the matching network; and activating at least one of a load switch or a tuning switch in response to the control signal, which is based on a V/I measurement, received from the power source received from the power source.

17. The method of claim 16, wherein the matching network further comprises an inductor connected in series with the tuning capacitor.

18. The method of claim 16, wherein the matching network further comprises a multiple level pulsing synchronization variable capacitor driver connected to each of the at least one capacitor connected in series with a load switch and the at least one capacitor connected in parallel with a tuning switch.

19. The method of claim 16, wherein the matching network further comprises a control algorithm that operates in a closed control loop that uses a tune capacitor position digitalized preset comprising a relay setting and a corresponding capacitor setting.

* * * * *